(12) United States Patent
Wang et al.

(10) Patent No.: US 10,818,878 B2
(45) Date of Patent: Oct. 27, 2020

(54) MANUFACTURING METHOD OF FLEXIBLE PANEL, FLEXIBLE PANEL AND DISPLAY DEVICE

(71) Applicant: BOE TECHNOLOGY GROUP CO., LTD., Beijing (CN)

(72) Inventors: Dongfang Wang, Beijing (CN); Tongshang Su, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 244 days.

(21) Appl. No.: 15/743,849

(22) PCT Filed: Jul. 14, 2017

(86) PCT No.: PCT/CN2017/092965
§ 371 (c)(1),
(2) Date: Jan. 11, 2018

(87) PCT Pub. No.: WO2018/120765
PCT Pub. Date: Jul. 5, 2018

(65) Prior Publication Data
US 2019/0006633 A1    Jan. 3, 2019

(30) Foreign Application Priority Data

Dec. 26, 2016    (CN) .......................... 2016 1 1219101

(51) Int. Cl.
*H01L 51/00*    (2006.01)
*H01L 51/56*    (2006.01)
(Continued)

(52) U.S. Cl.
CPC .......... *H01L 51/56* (2013.01); *H01L 27/1218* (2013.01); *H01L 27/1266* (2013.01);
(Continued)

(58) Field of Classification Search
None
See application file for complete search history.

(56) References Cited

U.S. PATENT DOCUMENTS

2011/0114993 A1* 5/2011 Lee ...................... H01L 51/003
257/100
2014/0158411 A1    6/2014 Ryu et al.
(Continued)

FOREIGN PATENT DOCUMENTS

CN    1194452 A    9/1998
CN    101154561 A    4/2008
(Continued)

OTHER PUBLICATIONS

First Indian Search Report dated Sep. 30, 2019.
(Continued)

*Primary Examiner* — Xiaobei Wang
(74) *Attorney, Agent, or Firm* — Dilworth & Barrese, LLP.; Michael J. Musella, Esq.

(57) ABSTRACT

Disclosed are a manufacturing method of a flexible panel, a flexible panel and a display device. The manufacturing method of a flexible panel includes: forming a deformable material layer on a base substrate, the deformable material layer includes a shape memory material; forming a flexible panel body at a side of the deformable material layer away from the base substrate; driving the deformable material layer to allow the flexible panel body to be at least partially stripped; and stripping the base substrate.

10 Claims, 3 Drawing Sheets

(51) Int. Cl.
  *H01L 27/12* (2006.01)
  *H01L 29/786* (2006.01)
  *H01L 27/32* (2006.01)

(52) U.S. Cl.
  CPC ...... *H01L 29/78603* (2013.01); *H01L 51/003* (2013.01); *H01L 51/0097* (2013.01); *H01L 27/3262* (2013.01)

(56) References Cited

U.S. PATENT DOCUMENTS

| | | | |
|---|---|---|---|
| 2015/0171354 A1* | 6/2015 | Lee | H01L 27/3244 438/26 |
| 2015/0270321 A1 | 9/2015 | Jinbo et al. | |
| 2016/0004032 A1* | 1/2016 | Wiklof | G02B 7/10 359/846 |
| 2016/0209877 A1 | 7/2016 | Chong et al. | |
| 2017/0068318 A1* | 3/2017 | McClure | G06F 3/016 |
| 2017/0154902 A1 | 6/2017 | Eguchi et al. | |

FOREIGN PATENT DOCUMENTS

| | | | |
|---|---|---|---|
| CN | 101236897 A | | 8/2008 |
| CN | 103481507 | * | 1/2014 |
| CN | 105449124 A | | 6/2016 |
| CN | 105355645 B | | 7/2019 |
| EP | 0867923 B1 | | 3/1998 |
| KR | 1020060078700 A | | 7/2006 |
| KR | 1020140080272 A | | 6/2014 |
| KR | 1020160002556 A | | 1/2016 |

OTHER PUBLICATIONS

International Search Report dated Oct. 16, 2017.
Han et al. "PH-Induced Shape-Memory Polymers", Macromolecular Rapid Communications, Jun. 27, 2012, pp. 1055-1060, vol. 33, No. 2, Chengdu China.
Extended European Search Report from corresponding European Patent Application No. 17825093.2 dated Jun. 30, 2020.

* cited by examiner

US 10,818,878 B2

MANUFACTURING METHOD OF FLEXIBLE PANEL, FLEXIBLE PANEL AND DISPLAY DEVICE

The present application claims priority of China Patent application No. 201611219101.3 filed on Dec. 26, 2016, the content of which is incorporated in its entirety as portion of the present application by reference herein.

TECHNICAL FIELD

Embodiments of the present disclosure relate to a manufacturing method of a flexible panel, a flexible panel and a display device.

BACKGROUND

With the continuous development of display technology, flexible display technology draws more and more attentions. The flexible display technology can be applied to various electronic devices, particularly to wearable electronic devices, so as to provide more abundant interactive experience for the people.

At another aspect, with the continuous development of material technology, shape memory material gradually draws the attentions of people. Generally, the shape memory material comprises a shape memory alloy, a shape memory ceramic, a shape memory polymer, and the like. The common characteristics of them lie in: after fixing the shape, the shape memory material can recover a preset state upon being stimulated by an external condition such as heat.

SUMMARY

Disclosed are a manufacturing method of a flexible panel, a flexible panel and a display device. The manufacturing method of the flexible panel can largely reduce a bonding force between the flexible panel body and the deformable material layer, and the base substrate, to allow the base substrate to be easily stripped, so as to obtain the flexible panel. Besides, the damage on the flexible panel upon being stripped by a relatively large force can be avoided, so as to improve the yield of the flexible panel.

At least one embodiment of the present disclosure provides a manufacturing method of a flexible panel, comprising: forming a deformable material layer on a base substrate, wherein the deformable material layer comprises a shape memory material; forming a flexible panel body at a side of the deformable material layer away from the base substrate; driving the deformable material layer to allow the flexible panel body to be at least partially stripped from the base substrate; and stripping the base substrate.

For example, in the manufacturing method of the flexible panel provided by an embodiment of the present disclosure, driving the deformable material layer to deform the deformable material layer and at least partially separate the deformable material layer from the base substrate.

For example, in the manufacturing method of the flexible panel provided by an embodiment of the present disclosure, a shape of the deformable material layer after being deformed comprises at least one curved portion.

For example, in the manufacturing method of the flexible panel provided by an embodiment of the present disclosure, the driving the deformable material layer to deform the deformable material layer and at least partially separate the deformable material layer from the base substrate comprises: utilizing a chemical driving method or a physical driving method to drive the deformable material layer to deform the deformable material layer and at least partially separate the deformable material layer from the base substrate.

For example, in the manufacturing method of the flexible panel provided by an embodiment of the present disclosure, the chemical driving method comprises: pH value change, equilibrium ion replacement, chelation reaction or redox reaction.

For example, in the manufacturing method of the flexible panel provided by an embodiment of the present disclosure, the manufacturing method of the flexible panel further comprises: before forming the flexible panel body, fixing an initial shape of the deformable material layer; and after stripping the base substrate, driving the deformable material layer to recover the initial shape.

For example, in the manufacturing method of the flexible panel provided by an embodiment of the present disclosure, the shape memory material comprises at least one selected from a group consisting of a shape memory alloy, a shape memory ceramic, and an organic shape memory material.

For example, in the manufacturing method of the flexible panel provided by an embodiment of the present disclosure, the manufacturing method of the flexible panel further comprises: before driving the deformable material layer to deform the deformable material layer, packaging the flexible panel body.

For example, in the manufacturing method of the flexible panel provided by an embodiment of the present disclosure, a radius of curvature of the curved portion is larger than 1 meter.

For example, in the manufacturing method of the flexible panel provided by an embodiment of the present disclosure, the flexible panel body comprises at least one of a flexible display panel and a flexible touch panel.

For example, in the manufacturing method of the flexible panel provided by an embodiment of the present disclosure, forming the flexible panel body comprises: forming a flexible thin film on the deformable material layer; forming a thin film transistor on the flexible thin film; and forming a first electrode on the thin film transistor.

For example, in the manufacturing method of the flexible panel provided by an embodiment of the present disclosure, forming the flexible panel body comprises: directly forming a thin film transistor on the deformable material layer; and forming a first electrode on the thin film transistor.

For example, in the manufacturing method of the flexible panel provided by an embodiment of the present disclosure, forming the flexible panel body further comprises: forming an organic light emitting layer on the first electrode.

At least one embodiment of the present disclosure provides a flexible panel, comprising: a deformable material layer, comprising a shape memory material; and a flexible panel body, disposed on the deformable material, the deformable material layer is configured to deform upon being driven.

For example, in the flexible panel provided by an embodiment of the present disclosure, the deformable material layer is configured to recover an initial shape upon being driven.

For example, in the flexible panel provided by an embodiment of the present disclosure, the flexible panel body is disposed on an entirety of the deformable material layer.

For example, in the flexible panel provided by an embodiment of the present disclosure, a shape of the deformable material layer after being deformed comprises at least one curved portion.

For example, in the flexible panel provided by an embodiment of the present disclosure, the shape memory material comprises a shape memory alloy, a shape memory ceramic, or an organic shape memory material.

For example, in the flexible panel provided by an embodiment of the present disclosure, a radius of curvature of the curved portion is larger than 1 meter.

At least one embodiment of the present disclosure provides a display device, comprising any one of the above-mentioned flexible panel.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used herein have the same meanings as commonly understood by one of ordinary skill in the art to which the present disclosure belongs. The terms "first", "second", etc., which are used in the description and the claims of the present disclosure, are not intended to indicate any sequence, amount or importance, but distinguish various components. The terms "comprises", "comprising", etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Embodiments of the present disclosure provide a manufacturing method of a flexible panel, a flexible panel and a display device. The manufacturing method of the flexible panel comprises: forming a deformable material layer on a base substrate, wherein the deformable material layer comprises a shape memory material; forming a flexible panel body at a side of the deformable material layer away from the base substrate; driving the deformable material layer to allow the flexible panel body to be at least partially stripped; and stripping the base substrate. Thus, the manufacturing method of the flexible panel can firstly form a flexible display panel body on a rigid base substrate, and then at least partially separate the flexible panel body from the base substrate through deformation of the deformable material layer, so as to largely reduce a bonding force between the flexile panel body and the deformable material layer, and the base substrate, so as to allow the base substrate to be easy stripped to obtain the flexible panel. Besides, the damage on the flexible panel upon being stripped by a relatively large force can be avoided, so as to improve the yield of the flexible panel.

Hereafter, the manufacturing method of the flexible panel, the flexible panel and the display device provided by the embodiments of the present disclosure will be described with reference to the accompanying drawings.

Figure 1:
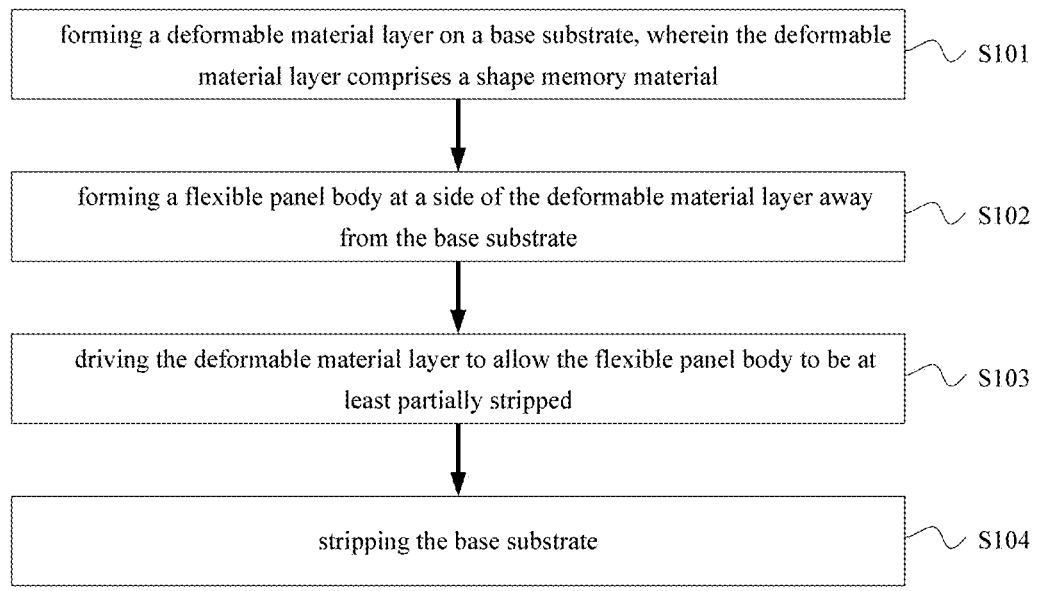
FIG. 1 is a flow diagram of a manufacturing method of a flexible panel provided by an embodiment of the present disclosure.

At least one embodiment of the present disclosure provides a manufacturing method of a flexible panel, as illustrated by FIG. 1, the manufacturing method of the flexible panel comprises the following steps S101-S104.

Step S101: forming a deformable material layer on a base substrate, the deformable material layer includes a shape memory material.

Figure 2:
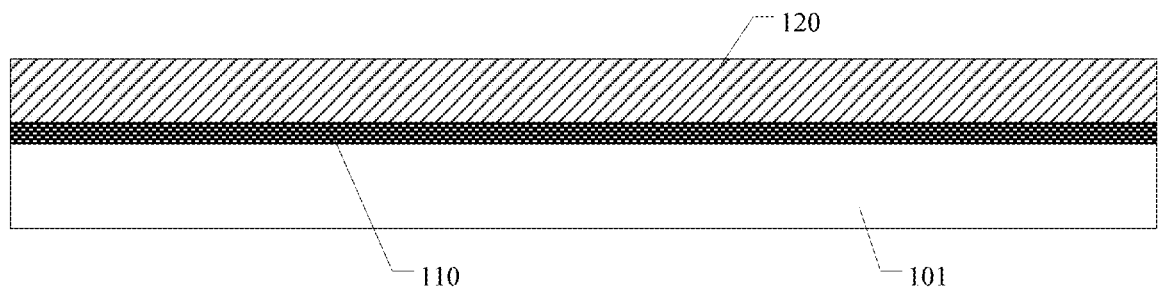
FIG. 2 is a step diagram of a manufacturing method of a flexible panel provided by an embodiment of the present disclosure.

For example, as illustrated by FIG. 2, a deformable material layer 110 is formed on a rigid base substrate 101. The base substrate 101 can be a rigid substrate, such as a glass substrate, a quartz substrate, a plastic substrate, and the like.

For example, the base substrate 101 can be a flat substrate.

Step S102: forming a flexible panel body at a side of the formation material layer away from the base substrate.

For example, as illustrated by FIG. 2, a flexible panel body 120 is formed on the base substrate 101. The flexible panel body 120 can be a flexible display panel and/or flexible touch panel.

Step S103: driving the deformable material layer to allow the flexible panel body to be at least partially stripped.

Figure 3:
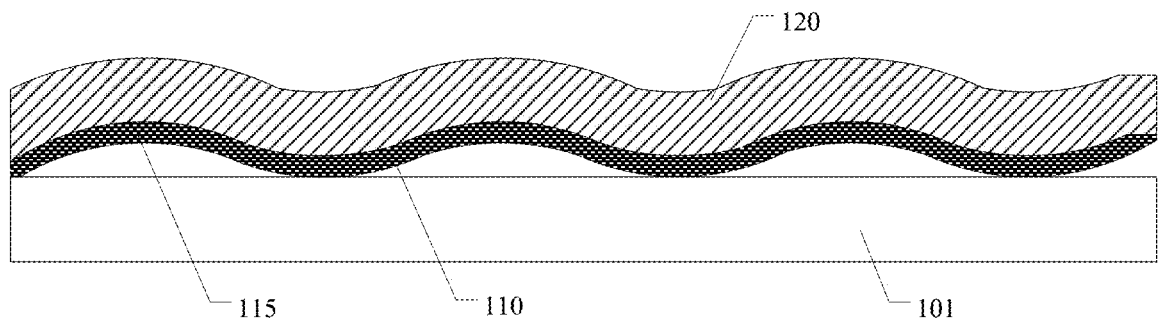
FIG. 3 is a step diagram of another manufacturing method of a flexible panel provided by an embodiment of the present disclosure.

For example, as illustrated by FIG. 3, driving the deformable material layer 110 to deform the deformable material layer 110, so as to at least partially separate it from the base substrate 101, so as to allow the flexible panel body 120 to be at least partially stripped.

For example, the deformable material layer 110 after being deformed comprises at least one curved portion 115.

Step S104: stripping the base substrate.

Figure 4:
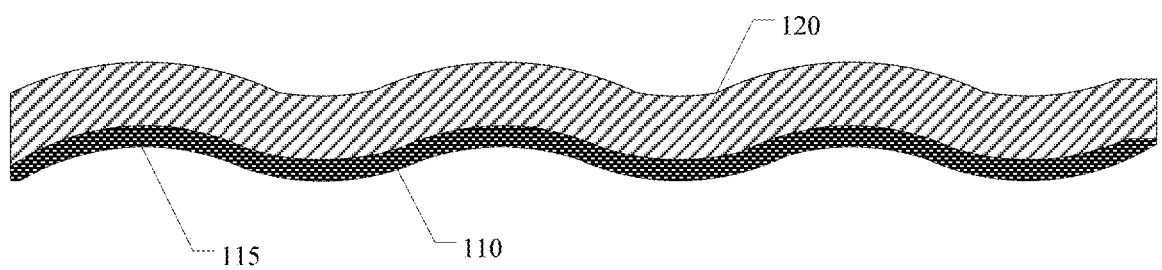
FIG. 4 is a step diagram of another manufacturing method of a flexible panel provided by an embodiment of the present disclosure.

For example, as illustrated by FIG. 4, the base substrate is stripped, so as to obtain the flexible substrate.

In the manufacturing method of the flexible panel provided by the present embodiment, by means of forming a deformable material layer and a flexible panel body on a rigid base substrate, and then driving the deformable material layer to deform to produce at least one curved portion, the at least one curved portion comprises a portion contacting the base substrate and a portion separated from the base substrate, and the bonding force between the flexible panel body and the deformable material layer, and the base substrate can be largely reduced, so as to allow the base substrate to be easily stripped, so as to obtain the flexible substrate. Besides, the manufacturing method of the flexible panel provided by the present embodiment can avoid the damage on the flexible panel upon being stripped by a relatively large force, so as to improve the yield of the flexible panel. At another aspect, because the deformable material layer and the flexible panel body formed on the base substrate can be manufactured by a manufacturing device of a non-flexible panel body, the costs of the manufacturing method of the flexible panel provided by the present embodiment can be reduced. It is to be noted that, in the manufacturing method of the flexible panel provided by the present embodiment, after stripping the base substrate, the deformable material can be removed or remained according to the practical situation; the present embodiment is not limited thereto.

For example, in the manufacturing method of the flexible panel provided by an example of the present embodiment, a shape of the deformable material layer after being deformed comprises a plurality of curved portions.

For example, in a case where the flexible panel to be manufactured is a flexible display panel or a flexible touch panel, if the deformable material layer affects the display of the flexible display panel or the touch of the flexible touch panel, or affects the thickness of the flexible display panel or the flexible touch panel, the deformable material layer can be removed; for example, the deformable material layer can be removed through a dissolution way, etc.

For example, in the manufacturing method of the flexible panel provided by an example of the present embodiment, a radius of curvature of the curved portion is larger than 1 meter. Thus, the defects caused by a too large shape variation of the deformable material layer can be prevented.

For example, in the manufacturing method of the flexible panel provided by an example of the present embodiment, a chemical driving method or a physical driving method can be utilized to drive the deformable material layer to deform the deformable material layer and at least partially separate it from the base substrate.

For example, the chemical driving method can comprise: pH value change, equilibrium ion replacement, chelation reaction or redox reaction. For example, by immersing the base substrate, the deformable material layer and the flexible panel body into a preconfigured solution, so as to realize changing the pH value of the deformable material layer or producing equilibrium ion replacement, chelation reaction or redox reaction with the deformable material layer. Certainly, the embodiments of the present disclosure are not limited thereto, and other chemical driving methods can be selected according to the performance of the deformable material layer. Besides, because the method of changing the pH value can utilize a wet etching device used in a manufacturing device of a non-flexible panel (normal panel), the costs of the manufacturing method of the flexible panel provided by the present embodiment can be further reduced.

For example, the physical driving method can comprise: temperature change (heat driving), electrical driving, or the like. For example, the method of placing the base substrate, the deformable material layer and the flexible panel body on a heating machine or applying a voltage to the base substrate, the deformable material layer and the flexible panel body can be adopted. Certainly, the embodiments of the present disclosure comprise but are not limited thereto, and other chemical methods can be selected according to the performance of the deformable material.

For example, in the manufacturing method of the flexible panel provided by an example of the present embodiment, the manufacturing method further includes: before forming the flexible panel body, fixing an initial shape of the deformable material layer, for example, a flat shape; and after stripping the base substrate, driving the deformable material layer to recover the initial shape.

Figure 5:
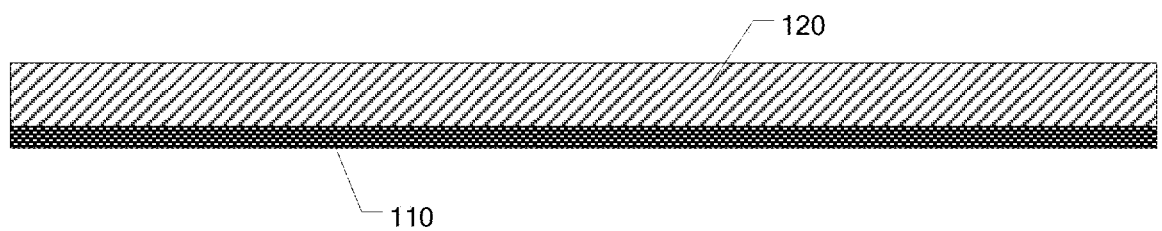
FIG. 5 is a structural schematic diagram of a flexible panel provided by an embodiment of the present disclosure.
Figure 6:
FIG. 6 is a structural schematic diagram of another flexible panel provided by an embodiment of the present disclosure.

For example, after forming a deformable material layer on the base substrate, before forming the flexible panel body on the deformable material layer, fixing an initial shape of the deformable material layer. For example, the shape of the deformable material layer can be fixed through a heating method or the like. Then, as illustrated by FIG. 5, after stripping the base substrate, the deformable material layer can be driven to recover the initial shape which is fixed before. It is to be noted that, the abovementioned "driving" can comprise adding an external stimulation (a physical driving method or a chemical driving method), or cancelling the external stimulation (a physical driving method or a chemical driving method) applied in the step of driving the deformable material layer to deform the deformable material layer and at least partially separate it from the base substrate, and the embodiments of the present disclosure are not limited thereto. Besides, as illustrated by FIG. 6, after driving the deformable material layer to recover the initial shape which is fixed before, the deformable material layer can be removed. Certainly, the deformable material layer can be remained, and the embodiments of the present disclosure are not limited thereto.

For example, in the manufacturing method of the flexible panel provided by an example of the present embodiment, the deformable material layer comprises a shape memory material.

For example, in the manufacturing method of the flexible panel provided by an example of the present embodiment, the shape memory material can comprise at least one selected from the group consisting of a shape memory alloy, a shape memory ceramic, and an organic shape memory material.

For example, in the manufacturing method of the flexible panel provided by an example of the present embodiment, the deformable material layer is an organic shape memory material, such as: saponified polyacrylamide, polyvinyl alcohol, and polyacrylic acid mixture thin film. Upon the deformable material layer adopting saponified polyacrylamide, polyvinyl alcohol, and polyacrylic acid mixture thin film, by adjusting the pH value, the deformable material layer can be driven to deform, and a shape variation of the deformable material layer can be controlled, so as to prevent the defects caused by an excessive shape variation. Besides, because the method of adjusting the pH value can utilize a wet etching device used in the manufacturing device of a non-flexible panel body, the costs of the manufacturing method of the flexible panel provided by the present embodiment can be further reduced.

For example, in the manufacturing method of the flexible panel provided by an example of the present embodiment, the manufacturing method can further comprise: before driving the deformable material layer to deform the deformable material layer, packaging the flexible panel body. Thus, the bad influence of the physical driving method or chemical driving method for driving the deformable material to deform on the flexible panel body can be avoided.

Figure 7:
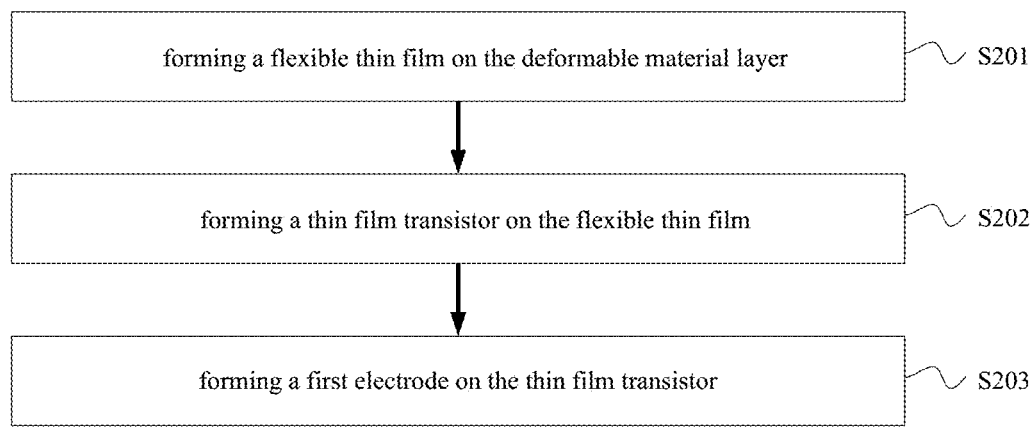
FIG. 7 is a flow diagram of another manufacturing method of a flexible panel provided by an embodiment of the present disclosure.

At least one embodiment of the present disclosure provides a manufacturing method of a flexible panel, as illustrated by FIG. 7, forming a flexible panel body on the deformable material layer can comprise the following steps S201-S203.

Step S201: forming a flexible thin film on the deformable material layer.

Figure 8:
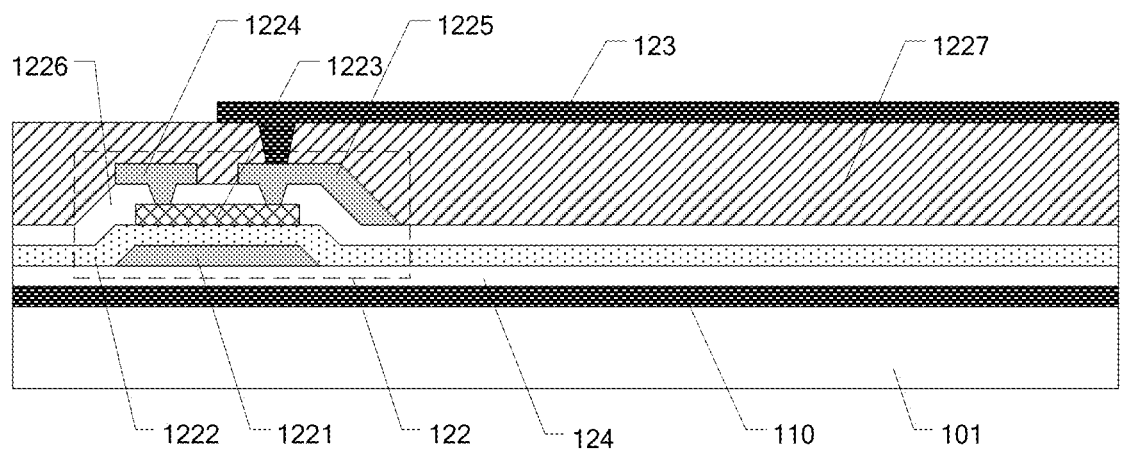
FIG. 8 is a step diagram of a manufacturing method of a flexible panel provided by an embodiment of the present disclosure.

For example, as illustrated by FIG. 8, a flexible thin film 124 is formed on the deformable material layer 110.

Step S202: forming a thin film transistor 122 on the flexible thin film 124.

For example, as illustrated by FIG. 8, forming a gate electrode 1221 on the flexible thin film 124; forming a gate insulating layer 1222 covering the gate electrode 1221 on the gate electrode 1221 and the flexible thin film 124; forming an active layer 1223 at a position of the gate insulating layer 1222 where the gate electrode 1221 is located; forming an etching stop layer 1226 on the active layer 1223; and forming a source electrode 1224 and a drain electrode 1225 on the etching stop layer 1226. The source electrode 1224 and the drain electrode 1225 can be connected with the active layer 1223 through via holes in the etching barrier layer 1226. The gate electrode 1221, the gate insulating layer 1222, the active layer 1223, the etching stop layer 1226, the source electrode 1224 and the drain electrode 1225 which are illustrated by FIG. 8 can form a thin film transistor 122 with an ESL (Etching Stop Layer) structure, the embodiments of the present disclosure comprise but are not limited thereto, the thin film transistor 122 can be a thin film transistor with a top gate structure or a back channel etching structure.

Step S203: forming a first electrode 123 on the thin film transistor 122.

For example, as illustrated by FIG. 8, a passivation layer 1227 is formed on the source electrode 1224 and the drain electrode 1225, and a first electrode 123 is formed on the thin film transistor 122 and the passivation layer 1227. The first electrode 123 is electrically connected with the drain electrode 1225 through a via hole in the passivation layer 1227. It is to be noted that, in a case that the first electrode 123 is a pixel electrode, the flexible panel body can be a flexible liquid crystal display panel.

For example, in the manufacturing method of the flexible panel provided by an example of the present embodiment, a thin film transistor can be directly formed on the deformable material layer, and a first electrode is formed on the thin film transistor.

Figure 9:
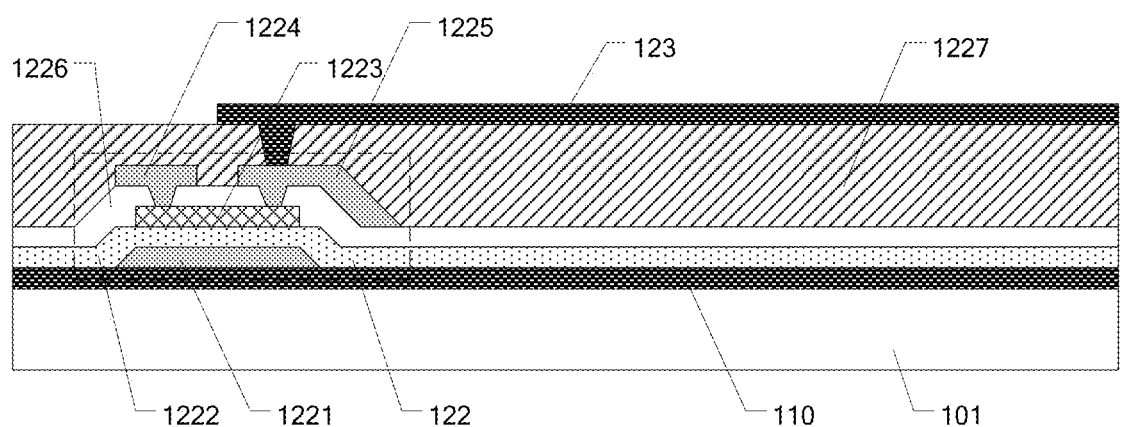
FIG. 9 is a step diagram of another manufacturing method of a flexible panel provided by an embodiment of the present disclosure.

For example, as illustrated by FIG. 9, forming a gate electrode 1221 on the deformable material layer 110; forming a gate insulating layer 1222 covering the gate electrode 1221 on the gate electrode 1221 and the flexible thin film 124; forming an active layer 1223 at a position of the gate insulating layer 1222 where the gate electrode 1221 is located; forming an etching stop layer 1226 on the active layer 1223; and forming a source electrode 1224 and a drain electrode 1225 on the etching stop layer 1226. The source electrode 1224 and the drain electrode 1225 can be connected with the active layer 1223 through via holes in the etching barrier layer 1226. Forming a passivation layer 1227 on the source electrode 1224 and the drain electrode 1225, forming a first electrode 123 on the thin film transistor 122 and the passivation layer 1227. The first electrode 123 is electrically connected with the drain electrode 1225 through a via hole in the passivation layer 1227. The gate electrode 1221, the gate insulating layer 1222, the active layer 1223, the etching stop layer 1226, the source electrode 1224 and the drain electrode 1225 which are illustrated in FIG. 9 can form a thin film transistor 122 with an ESL (Etching Stop Layer) structure, the embodiments of the present disclosure comprise but are not limited thereto, the thin film transistor 122 can be a thin film transistor with a top gate structure or a back channel etching structure.

For example, in the manufacturing method of the flexible panel provided by an example of the present embodiment, the manufacturing method further comprises: forming an organic light emitting layer on the first electrode.

Figure 10:
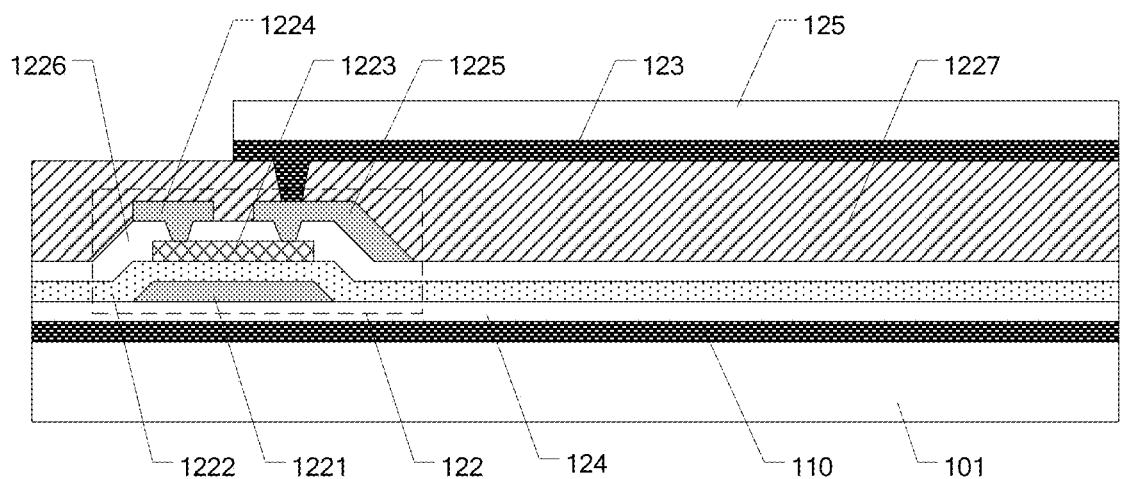
FIG. 10 is a step diagram of another manufacturing method of a flexible panel provided by an embodiment of the present disclosure.

For example, as illustrated by FIG. 10, an organic light emitting layer 125 is formed on the first electrode 123. At this time, the first electrode 123 can be an anode, and the flexible panel body can be a flexible OLED display panel. Certainly, the embodiments of the present disclosure comprise but are not limited thereto, and a touch electrode structure can be formed in the flexible panel body to form a flexible touch panel.

At least one embodiment of the present disclosure provides a flexible panel. As illustrated by FIG. 5, the flexible panel comprises a deformable material layer 110 and a flexible panel body 120. The flexible panel body 120 is disposed on the deformable material layer 110. For example, as illustrated by FIG. 5, the flexible panel body 120 is directly disposed on the deformable material layer 110, that is to say, the flexible panel body 120 contacts the deformable material layer 110. Besides, the deformable material layer 110 is configured to deform upon being driven. As illustrated by FIG. 4, a shape of the deformable material layer 110 after being deformed comprises at least one curved portion.

In the flexible panel provided by the present embodiment, by means of forming a deformable material layer and a flexible panel body on a rigid base substrate, and then driving the deformable material layer to deform to produce at least one curved portion, the at least one curved portion comprises a portion contacting the base substrate and a portion separated from the base substrate, and the bonding force between the flexible panel body and the deformable material layer, and the base substrate can be largely reduced, so as to allow the base substrate to be easily stripped, so as to obtain the flexible substrate. Besides, a shape of the deformable material layer can be changed by an electric driving method, a heat driving method or the like, so as to provide more functions and interactive experience to the electronic devices adopting the flexible panel provided by the present embodiment.

For example, in the flexible panel provided by an example of the present embodiment, as illustrated by FIG. 5, the flexible panel body 120 is disposed on an entirety of the deformable material layer 110.

For example, in the flexible panel provided by an example of the present embodiment, the deformable material layer is configured to recover an initial shape, for example: a flat shape, upon being driven. The specific description may refer to the relevant description of the first embodiment, and the repeated portions are omitted herein.

For example, in the flexible panel provided by an example of the present embodiment, the deformable material layer comprises a shape memory material.

For example, the shape memory material comprises a shape memory alloy, a shape memory ceramic, or an organic shape memory material.

For example, in the flexible panel provided by an example of the present embodiment, the deformable material layer is an organic shape memory material, such as: saponified polyacrylamide, polyvinyl alcohol, and polyacrylic acid mixture thin film. Upon the deformable material layer adopting saponified polyacrylamide, polyvinyl alcohol, and polyacrylic acid mixture thin film, by adjusting the pH value, the deformable material layer can be driven to deform, and a shape variation of the deformable material layer can be controlled, so as to prevent the defects caused by an excessive shape variable. Besides, because the method of adjusting the pH value can utilize a wet etching device used in the manufacturing device of a non-flexible panel body, the costs of the flexible panel provided by the present embodiment can be further reduced.

For example, in the flexible panel provided by an example of the present embodiment, a radius of curvature of the curved portion is larger than 1 meter. Thus, the defects caused by a too large shape variable of the deformable material layer can be prevented.

For example, as illustrated by FIG. 8, the flexible panel body 120 can comprise a flexible thin film 124, a gate electrode 1221 formed on the flexible thin film 124; a gate insulating layer 1222 covering the gate electrode 1221 and formed on the gate electrode 1221 and the flexible thin film 124; an active layer 1223 formed at a position of the gate insulating layer 1222 where the gate electrode 1221 is located; an etching stop layer 1226 formed on the active layer 1223; and a source electrode 1224 and a drain electrode 1225 formed on the etching barrier layer 1226, the source electrode 1224 and the drain electrode 1225 can be connected with the active layer 1223 through via holes in the etching barrier layer 1226; a passivation layer 1227 formed on the source electrode 1224 and the drain electrode 1225; and a first electrode 123 formed on the thin film transistor 122 and the passivation layer 1227, the first electrode 123 is electrically connected with the drain electrode 1225 through a via hole in the passivation layer 1227. The gate electrode 1221, the gate insulating layer 1222, the active layer 1223, the etching stop layer 1226, the source electrode 1224 and the drain electrode 1225 which are illustrated by FIG. 8 can form a thin film transistor 122 with an ESL (Etching Stop Layer) structure, the embodiments of the present disclosure comprise but are not limited thereto, and the thin film transistor 122 can be a thin film transistor with a top gate structure or a back channel etching structure.

For example, as illustrated by FIG. 9, the flexible panel body 120 comprises a gate electrode 1221 on the deformable material layer 110; a gate insulating layer 1222 covering the gate electrode 1221 and formed on the gate electrode 1221 and the deformable material layer 110; an active layer 1223 formed at a position of the gate insulating layer 1222 where the gate electrode 1221 is located; an etching stop layer 1226 formed on the active layer 1223; and a source electrode 1224 and a drain electrode 1225 formed on the etching stop layer 1226, the source electrode 1224 and the drain electrode 1225 can be connected with the active layer 1223 through via holes in the etching stop layer 1226; a passivation layer 1227 formed on the source electrode 1224 and the drain electrode 1225, a first electrode 123 formed on the thin film transistor 122 and the passivation layer 1227. The first electrode 123 is electrically connected with the drain electrode 1225 through a via hole in the passivation layer 1227.

For example, as illustrated by FIG. 10, the flexible panel body 120 can comprise an organic light emitting layer 125 disposed on the first electrode 123. At this time, the first electrode 123 is an anode, and the flexible panel can be a flexible OLED display panel.

At least one embodiment provides a display device, which comprises the flexible panel according to any one of the abovementioned embodiments. Because the display device comprises the flexible panel according to any one of the abovementioned embodiments, the display device has the technical effect corresponding to the technical effect of the abovementioned flexible panel, and the detailed description can refer to the relevant description in the third embodiment, and the repeated portions are omitted herein.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

The foregoing is only some specific embodiments of the present invention and not intended to limit the scope of protection of the present invention. Any variations or replacements which can be easily thought of by those skilled in the art in the scope of the present disclosure all shall fall within the scope of protection of the present disclosure. The scope of protection of the present invention should be defined by the appended claims.

What is claimed is:

1. A manufacturing method of a flexible panel, comprising:
    forming a deformable material layer on a base substrate, wherein the deformable material layer comprises a shape memory material, and the shape memory material is saponified polyacrylamide, polyvinyl alcohol, and polyacrylic acid mixture thin film;
    forming a flexible panel body at a side of the deformable material layer away from the base substrate;
    driving the deformable material layer to allow the flexible panel body to be at least partially stripped from the base substrate, by adjusting pH value in a wet etching device; and
    stripping the base substrate.

2. The manufacturing method of the flexible panel according to claim 1, wherein the deformable material layer is driven to deform the deformable material layer and at least partially separate the deformable material layer from the base substrate.

3. The manufacturing method of the flexible panel according to claim 1, wherein a shape of the deformable material layer after being deformed comprises more than one curved portion.

4. The manufacturing method of the flexible panel according to claim 1, further comprising:
    before forming the flexible panel body, fixing an initial shape of the deformable material layer; and
    after stripping the base substrate, driving the deformable material layer to recover the initial shape.

5. The manufacturing method of the flexible panel according to claim 1, further comprising:

before driving the deformable material layer to deform the deformable material layer, packaging the flexible panel body.

6. The manufacturing method of the flexible panel according to claim 3, wherein a radius of curvature of any of the curved portions is larger than 1 meter.

7. The manufacturing method of the flexible panel according to claim 1, wherein the flexible panel body comprises at least one of a flexible display panel and a flexible touch panel.

8. The manufacturing method of the flexible panel according to claim 1, wherein forming the flexible panel body comprises:
   forming a flexible thin film on the deformable material layer;
   forming a thin film transistor on the flexible thin film; and
   forming a first electrode on the thin film transistor.

9. The manufacturing method of the flexible panel according to claim 1, wherein forming the flexible panel body comprises:
   directly forming a thin film transistor on the deformable material layer, wherein the deformable material layer is directly in contact with the thin film transistor; and
   forming a first electrode on the thin film transistor.

10. The manufacturing method of the flexible panel according to claim 8, wherein forming the flexible panel body further comprises:
    forming an organic light emitting layer on the first electrode.

\* \* \* \* \*